(12) United States Patent
Oh et al.

(10) Patent No.: US 6,493,156 B1
(45) Date of Patent: Dec. 10, 2002

(54) HIGH RESOLUTION LENS

(75) Inventors: Hyeong-Ryeol Oh, Seoul (KR); Dae-Gab Gweon, Daejeon (KR)

(73) Assignee: LG Electronics Inc., Seoul (KR)

( * ) Notice: Subject to any disclaimer, the term of this patent is extended or adjusted under 35 U.S.C. 154(b) by 70 days.

(21) Appl. No.: 09/717,307

(22) Filed: Nov. 22, 2000

(51) Int. Cl.[7] ................................................ G02B 3/08
(52) U.S. Cl. ...................... 359/742; 359/727; 359/728; 359/729; 359/799; 359/800
(58) Field of Search ................................. 359/726, 738, 359/739, 742, 656, 661, 368, 799–800, 727–732

(56) References Cited

U.S. PATENT DOCUMENTS

| | | | | |
|---|---|---|---|---|
| 3,035,486 A | * | 5/1962 | Benford | 359/799 |
| 4,961,622 A | * | 10/1990 | Gorman et al. | 350/96.18 |
| 5,638,219 A | * | 6/1997 | Medina Puerta et al. | 359/729 |
| 6,229,782 B1 | * | 5/2001 | Wong et al. | 369/112.08 |

* cited by examiner

*Primary Examiner*—Georgia Epps
*Assistant Examiner*—M. Hasan
(74) *Attorney, Agent, or Firm*—Birch, Stewart, Kolasch & Birch, LLP

(57) ABSTRACT

A high resolution lens is provided as a condensing lens for collecting light made incident from a light source, of which one face is plane and the other face is curved. The curved face of the lens is coated with a reflecting material except for its central apex portion, and incident light is made incident through the plan portion of the lens. The curved face of the high resolution lens may be spherical or is a parabolic face to reduce aberration. When a parallel light is made incident on the plane face of the high resolution lens, it is reflected in the lens and totally reflected, and then is transmitted through the uncoated apex to an external object.

12 Claims, 13 Drawing Sheets

HIGH RESOLUTION LENS

BACKGROUND OF THE INVENTION

1. Field of the Invention

The present invention relates to a high resolution lens, and more particularly, to a high resolution parabolic lens which is capable of reducing the size of an optical spot to below a diffraction limit without using another condensing lens.

2. Description of the Background Art

Resolution of a microscope, a line width of a semiconductor exposing equipment, and a storage density in an information storage device have a direct relation with the size of a light spot.

That is, as the light spot becomes small, its resolution is increased, the line width of a semiconductor circuit can be reduced and the information storage density of the information recording apparatus can be increased.

The size of the light spot depends on the wave length of a light, a light convergency angle of a lens, a diameter of an incident beam, a refractivity of a medium on which a spot is formed, which can be expressed by the following formula:

$$d = 0.6\lambda/n^*\sin\theta$$

where 'd' indicates the diameter of a spot, $\lambda$ indicates a wavelength of a light, 'n' indicates refractivity, and $\theta$ indicates a convergency angle.

Accordingly, in order to reduce the light spot, the wave length is to be reduced, the refractivity is to be great and the convergency angle is to be great. However, the size of the light spot is limited to one-half of the wave length of the used light due to the-diffraction limit.

Accordingly, in order to reduce the light spot, the wave length is to be reduced, the refractivity is to be great and the convertency angle is to be great. However, the size of the light spot is limited to a half the wave length of the used light due to the diffraction limit.

Therefore, in an effort to overcome the diffraction limit and obtain a smaller light spot, there have been proposed several methods.

Blue laser light is used to reduce the wave length of the light, so that the wave length of about 600 nm can be reduced to about 400 nm.

In addition, a method has been proposed in which a lens having a high refractivity is used to reduce the spot. A solid immersion lens (referred to as SIL, hereinafter) is its typical example.

Figure 1:
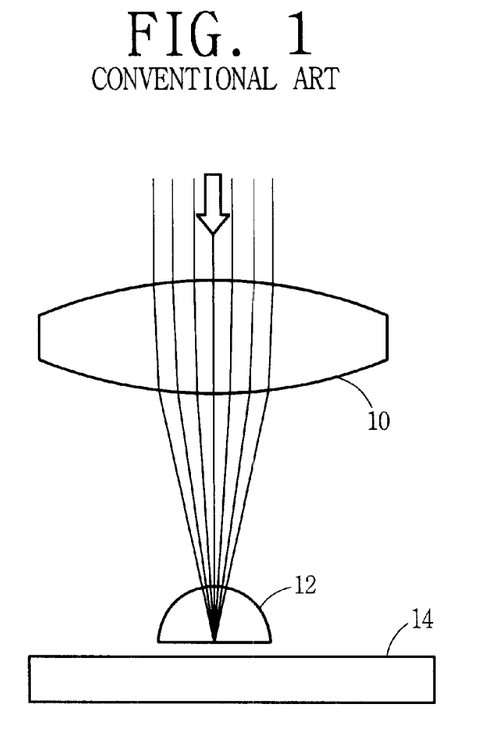
FIG. 1 illustrates an information recording apparatus using an SIL in accordance with a conventional art.

FIG. 1 illustrates an optical system in use for an information recording apparatus.

As shown in the drawing, the optical system includes a hemispherical SIL 12 and a first condensing lens 10.

The SIL 12 is adjacent to a recording medium 14 and has a hemispherical shape of which the upper surface is spherical and the lower surface is plane. The center of the plane portion of the SIL corresponds to the focus of the first condensing lens.

The light made incident on the first condensing lens is deflected and proceeds into the SIL. Since the focus of the first condensing lens exists at the center of the plane portion of the SIL, the incident light is collected at the center of the plane portion of the SIL.

The light convergency angle ($\theta$) is determined by the numerical aperture of the first condensing lens, and refractivity (n) is determined according to the material of the SIL. The maximum refractivity of the material used for the SIL is about 2.2, and the sine value ($\sin\theta$) of the convergency angle by the numerical aperture of the first condensing lens is possibly by 0.7. Therefore, in case of using a light of which wave length ($\lambda$) is 632 nm, the minimum spot size 'd' realizable with the SIL is about 246 nm.

Figure 2:
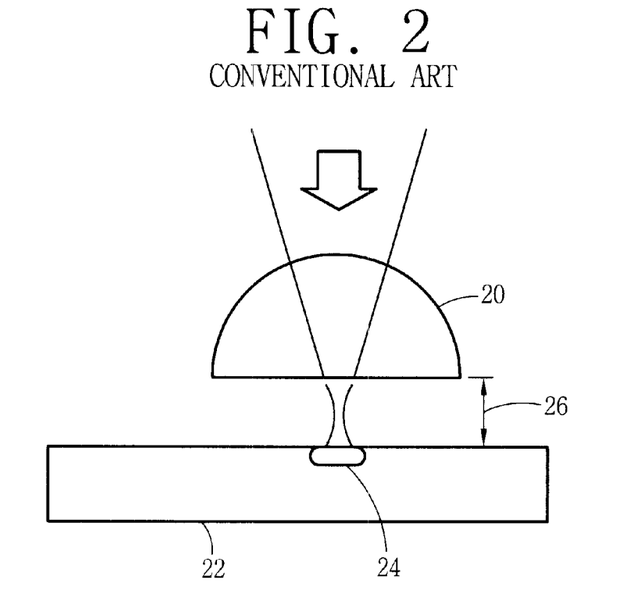
FIG. 2 illustrates recording of a data with the SIL in accordance with the conventional art.

In order to record a data (bit) on a disk by using the SIL, as shown in FIG. 2, the SIL 20 approaches the surface of a recording medium 22, leaving a space (26) of about 10~70 nm.

As the SIL 20 is approaching, a light near-field phenomenon occurs that the light energy first collected at the lower surface of the SIL is partially transmitted to the recording medium.

Thanks to the near-field phenomenon, a data can be recorded or reproduced on or from the surface of the recording medium. For example, the energy transmitted from the SIL heats a portion of the surface of the recording medium, causing a partial phase change, and a bit 24 is formed on the surface of the recording medium owing to the phase change, that is, data is recorded.

In case where a recorded data is read, a characteristic that the reflectivity is changed at the portion where the phase is changed is utilized.

That is, a light having a low intensity compared to the case of recording is made incident on the surface of the recording medium through the SIL, and the intensity of the light coming out through the SIL after being reflected on the surface of the recording medium is measured. Then, since the reflectivity is different according to the existence and non-existence of the bit, the data can be read.

As stated above, the optical system using the SIL overcomes the diffraction limit of the light as well as reducing the light spot, but also has the following problems.

Figure 3:
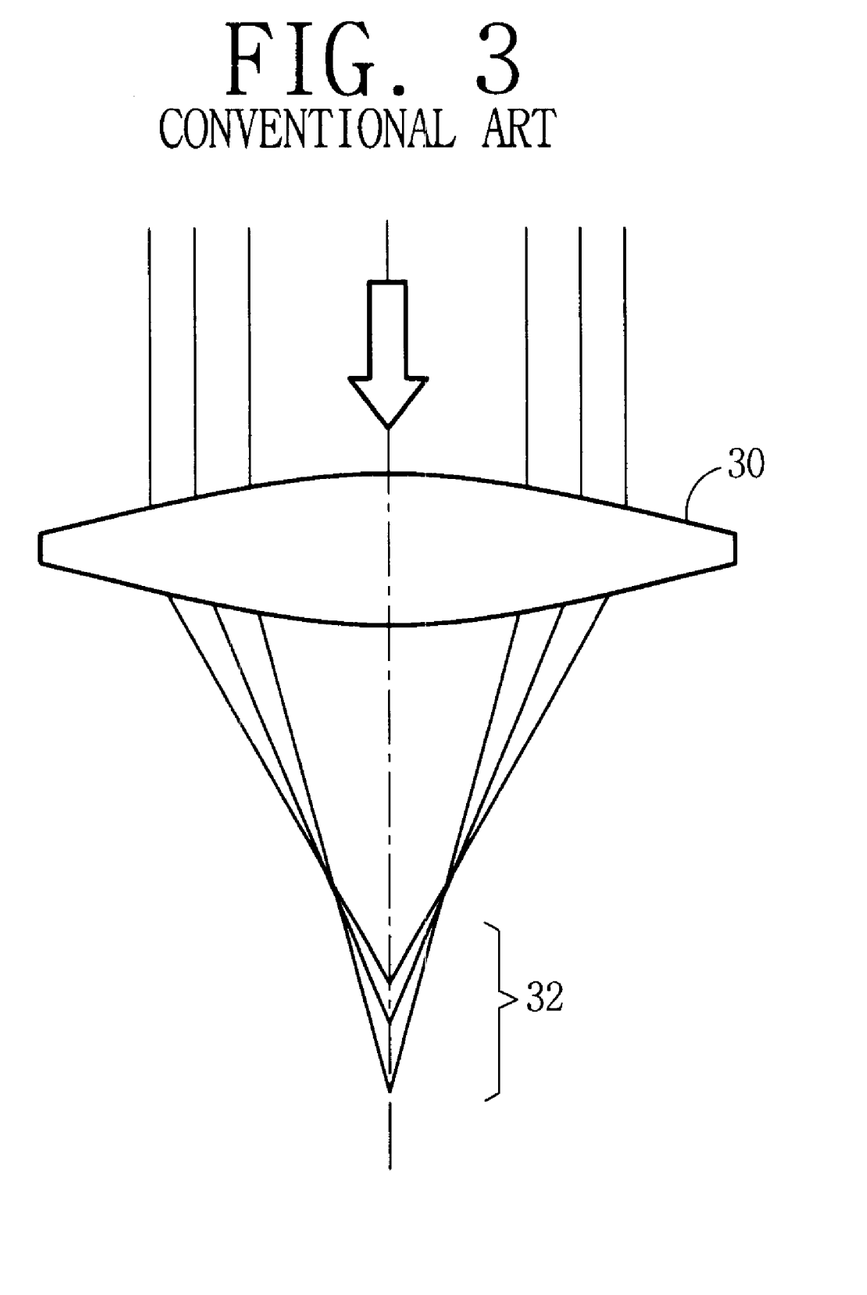
FIG. 3 illustrates aberration by a lens in accordance with the conventional art.

Generally, as shown in FIG. 3, the optical lens 30 has a problem of aberration that light is not collected at one point. The aberration becomes great as the magnification of the lens is high. In case of the optical system using the SIL, since it needs the first condensing lens, the aberration of the first condensing lens considerably degrades the first collecting capacity of the optical system.

In addition, in case of the hemispherical SIL using the near-field, since it needs to approach the recording medium or an object for measurement, there is a possibility of collision. The SIL has a plane bottom surface having a diameter of about 1 mm and should maintain the space of 50 nm with respect to the recording medium. Thus, since the plane face (having a diameter of 20000 times of the space) is relatively wide compared to the space, if the SIL is a bit inclined to the recording medium, it would collide the latter.

Moreover, the data recording and reproducing apparatus using the SIL needs the first condensing lens, causing- the apparatus to have a large volume and to be complicated. Also, it is difficult to assemble the whole data storing unit and the first condensing lens.

SUMMARY OF THE INVENTION

Therefore, an object of the present invention is to provide a high resolution near-field optical system directed to reducing a possibility of collision between a near-field optical system and a recording medium or an object for measurement.

Another object of the present invention is to provide a high resolution near-field optical system without having a first condensing lens.

Still another object of the present invention is to provide a high resolution lens of which light-collecting performance is remarkably enhanced by reducing its aberration.

Yet another object of the present invention is to fabricate various apparatuses simply by using the high resolution lens.

To achieve these and other advantages and in accordance with the purpose of the present invention, as embodied and broadly described herein, there is provided a high resolution lens for collecting light made incident from an external source, of which one surface is plane and other surface is curved and coated with a reflecting material except for its central top point (apex).

The curved face of the high resolution lens may be spherical or is preferably a parabolic face to reduce aberration.

When a parallel light is made incident on the plane face of the high resolution lens, it is reflected in the lens and totally reflected, and then is transmitted through the uncoated apex to an external object.

Also, the present invention introduces various techniques adopting the high resolution lens, including the information recording apparatus.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The high resolution lens of the present invention has a plan surface at one side and a curved face at the other side, and the curved face is coated with a reflecting material except for its apex. Light is made incident through the plane face and the incident light is reflected by the reflecting material of the curved face, and then totally reflected again on the plane face, so as to be collected at the apex of the center of the curved face of the lens.

The curved face may be a spherical or non-spherical one, and is preferably a parabolic face in order to reduce its aberration.

The lens of the present invention is able to obtain a high resolution without requiring a condensing lens, so that various applied apparatuses can be reduced in its size by adopting the lens of the present invention.

In addition, even though the surface of the lens approaches an object, there is not much possibility of damaging as the former collides the latter The high resolution lens of the present invention will now be described in detail with reference to the accompanying drawings.

Figure 4A:
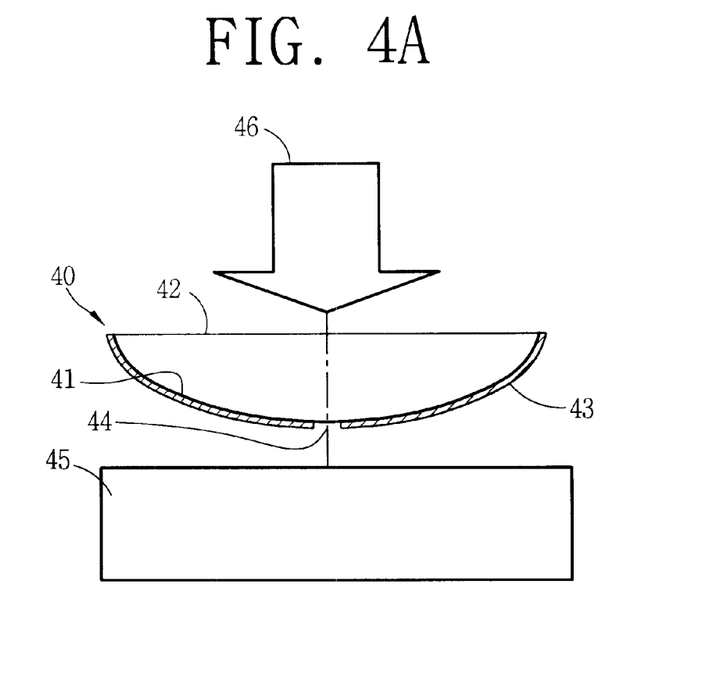
FIGS. 4A and 4B illustrate a high resolution lens in accordance with the present invention.
Figure 4B:
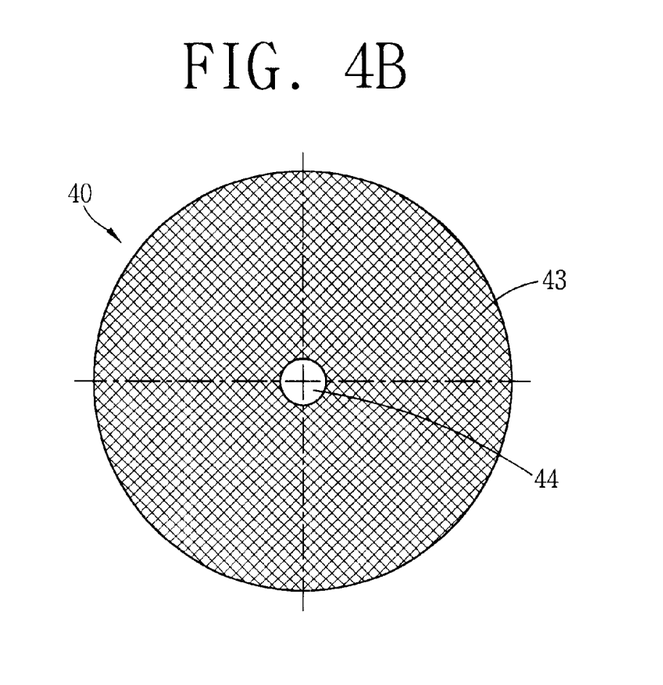

FIG. 4A illustrates a high resolution lens in accordance with the present invention and FIG. 4B shows a bottom surface of the lens of FIG. 4A according to an embodiment of the present invention.

As shown in the drawing, the high resolution lens 40 of the present invention is plane at one side 42 and curved at the other side 41.

The curved face 41 is coated with a reflecting material 43, so that light is reflected thereon, not transmitting it. The vicinity of the central apex 44 of the curved face is a light exit part, on which the reflecting material is not coated. An object for measurement or a recording medium 45 is positioned adjacent to the lower surface of the lens, that is, the curved face.

Figure 5:
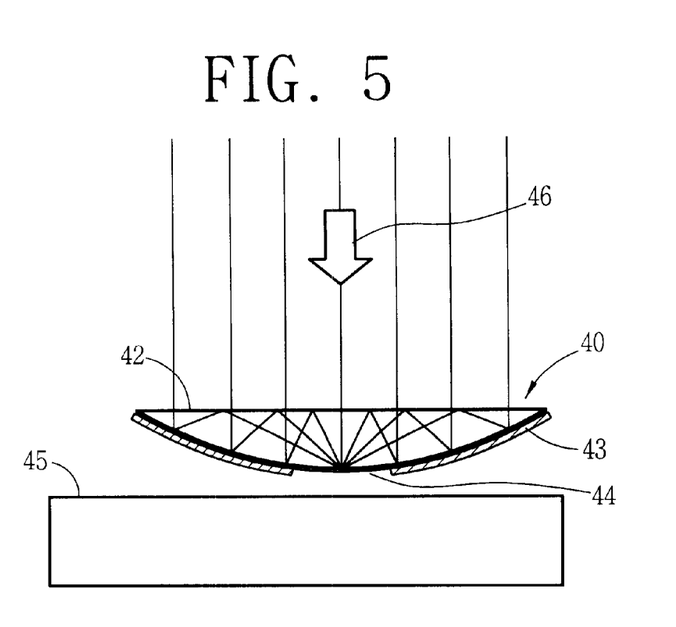
FIG. 5 illustrates movement paths of light on the high resolution lens in accordance with the present invention.

FIG. 5 illustrates movement paths of light on the high resolution lens in accordance with the present invention.

As shown in the drawing, the parallel light 46 made incident on the lens 40 is transmitted through the plane face 42 of the upper portion of the lens and is reflected by the curved face 41 due to the coated reflecting material 43.

The light reflected on the curved face 41 is again made incident on the plane face 42. In this respect, if the incident angle is greater than the critical angle, the light made incident on the plane face 42 from the curved face 41 is totally reflected and again made incident on the curved face 41.

After the parallel light is made incident on the plane face 42 of the lens, it is reflected on inside the lens for several times and transmitted through the light exit part of the apex 44 of the lens, which has not been coated with the reflecting material 43, to the object for measurement or the recording medium 45 or any other entity designated to receive this light.

In case that the curved face of the lens is in a parabolic shape, its aberration can be reduced.

Figure 6:
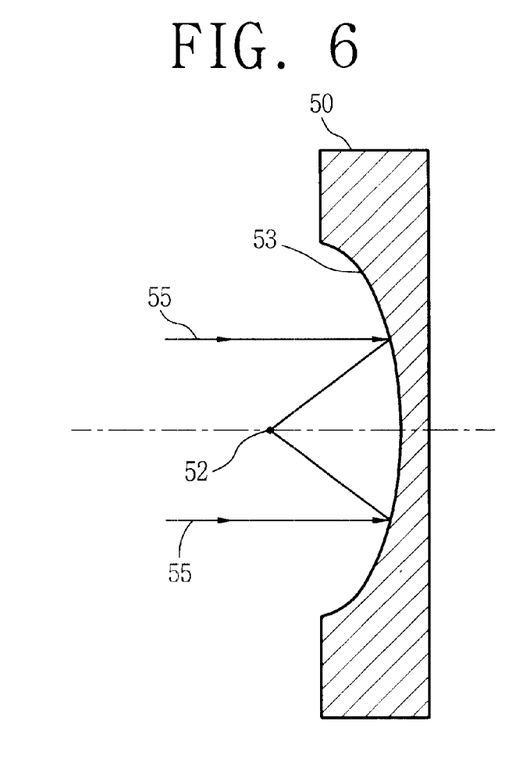
FIG. 6 illustrates a movement path of light made incident on a parabolic face of the high resolution lens in accordance with the present invention.

FIG. 6 illustrates a movement path of light made incident on a parabolic face of the high resolution lens in accordance with the present invention.

As shown in the drawing, when the parallel light is made incident on the parabolic face 53 on which the reflecting material has been coated, in view of the characteristic of the parabolic face, the incident light 55 is reflected on the parabolic face 53 and collected at the focal point 52 of the parabolic face.

Accordingly, unlike general optical lenses, the aberration of the parabolic face lens with the reflecting material coated is ideally '0', and thus the condensing performance of the lens is improved.

Figure 7:
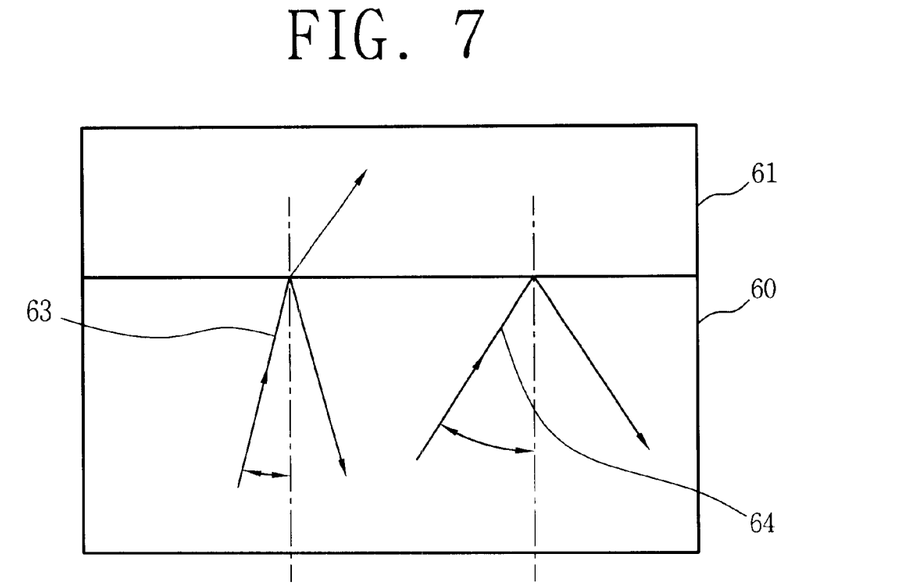
FIG. 7 illustrates total reflection of two medium having different refractivity to each other in accordance with the present invention.

FIG. 7 illustrates total reflection of two mediums having different refractivity to each other in accordance with the present invention. Total reflection of light occurs when the light proceeds from a medium having a high refractivity to a medium having a low refractivity.

As shown in the drawing, in case of the incident light 63 at the left side, when the light proceeds from a medium 60 having a low refractivity to a medium 61 having a high refractivity, the light is partly reflected and partly transmitted. Meanwhile, in case of the incident light 64 at the right side, the light is wholly reflected, rather than proceeding from the medium 60 to the medium 61. The incident angle of this case is greater than that of the case at the left side.

An incident angle at which a total reflection can be made is called a critical angle. That is, as to the light proceeding from the medium having a high refractivity to the medium having a low refractivity, in case that the incident angle is small, there is created a transmitted light and a reflected light, whereas, in case that the incident angle is greater than the critical angle, the incident light is totally reflected like the reflection on the mirror face.

The critical angle of the total reflection has something to do with the refractivity of the medium and is determined by the following formula:

$$\theta = \arc \sin(1/n)$$

wherein θ indicates a critical angle and 'n' indicates a refractivity of the medium.

Figure 8:
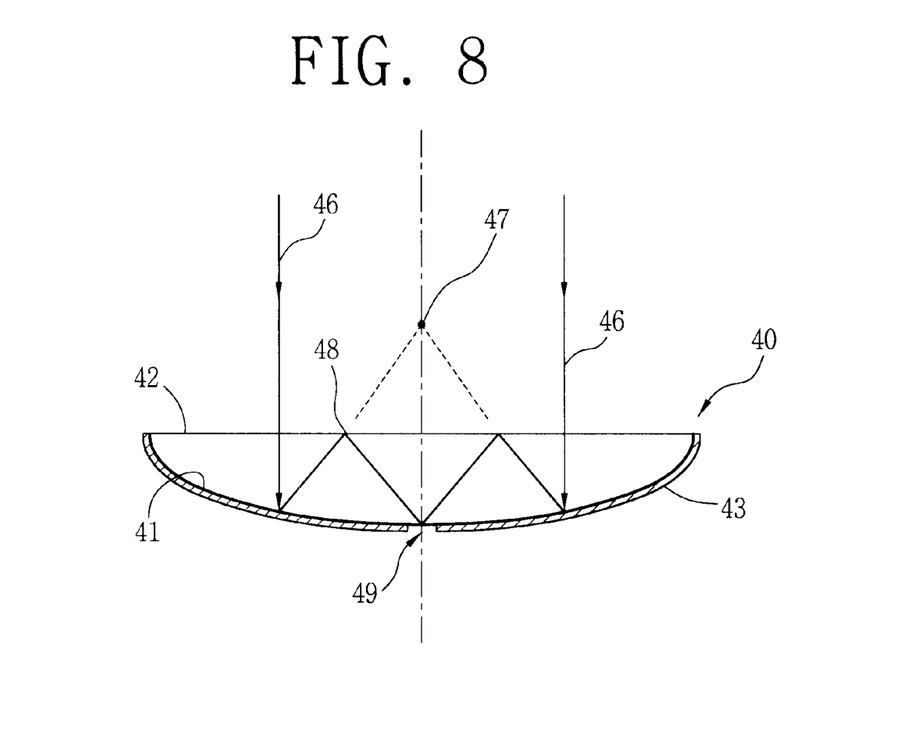
FIG. 8 illustrates a high resolution parabolic face lens in accordance with a first embodiment of the present invention.

FIG. 8 illustrates a high resolution parabolic face lens in accordance with a first embodiment of the present invention.

As shown in the drawing, the incident parallel light 46 passes the plane face 42 of the lens 40 and is reflected on the parabolic face 41 on which the reflecting material 43 has been coated, directing to the focal point 47 of the parabolic face.

When the light proceeding toward the focal point of the parabolic face is made incident on the plane face 42 of the lens 40 with a large angle, it is again reflected on the parabolic face 41 owing to the total reflection as mentioned above.

The parabolic focal point is formed at the apex 49 of the parabolic center, the symmetrical position on the basis of the plane portion. Accordingly, the light made incident in parallel on the lens is collected at the apex of the parabolic face.

Figure 9:
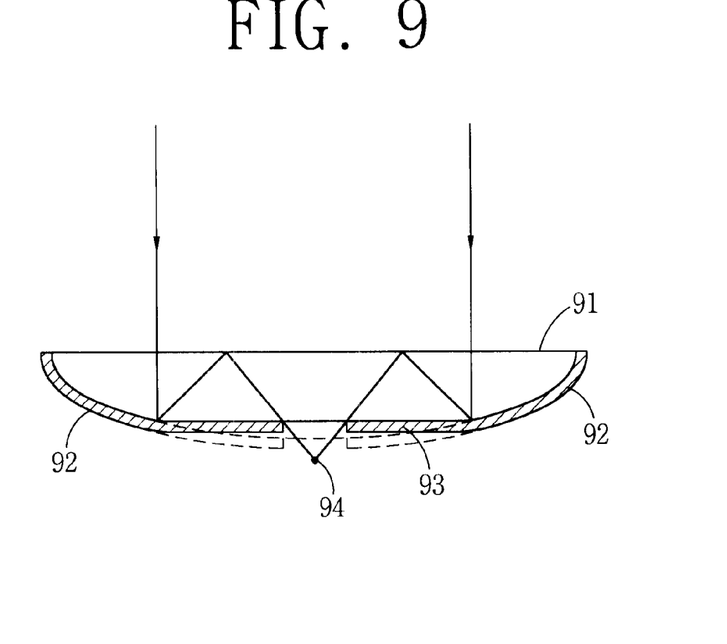
FIG. 9 illustrates a high resolution lens in accordance with a second embodiment of the present invention.

FIG. 9 illustrates a high resolution lens in accordance with a second embodiment of the present invention.

As shown in the drawing, the upper face 91 of the lens is plane and the lower face thereof is basically curved. A difference from the former embodiment is that a lower surface of the lens is partially cut out.

That is, the marginal portion 92 of the lower surface of the lens is curved, while the central portion 93 thereof is plane. The lower surface is coated with a reflecting material, of which the central apex is not coated with the reflecting material.

With this structure, in comparison with the lens of the former embodiment, the focal point of the lens is formed at a lower position 94 than the lower surface of the lens.

The optical system using the near-field is positioned near the recording medium or the object for measurement, and the region at which the focal point of light is formed is exposed at the atmosphere.

If the region at which the focal point is formed is contaminated with a contaminant such as dust, light is cut off. Since the light spot is very small in size of below micrometer, light is mostly cut off with a fine dust introduced in the optical path, causing a crucial problem for recording information or measuring an object. In case of the lens according to the embodiment of FIG. 9, since the focal point of the light is formed lower than the lower surface of the lens, there is a less possibility that the light is cut off due to a contaminant.

Figure 10:
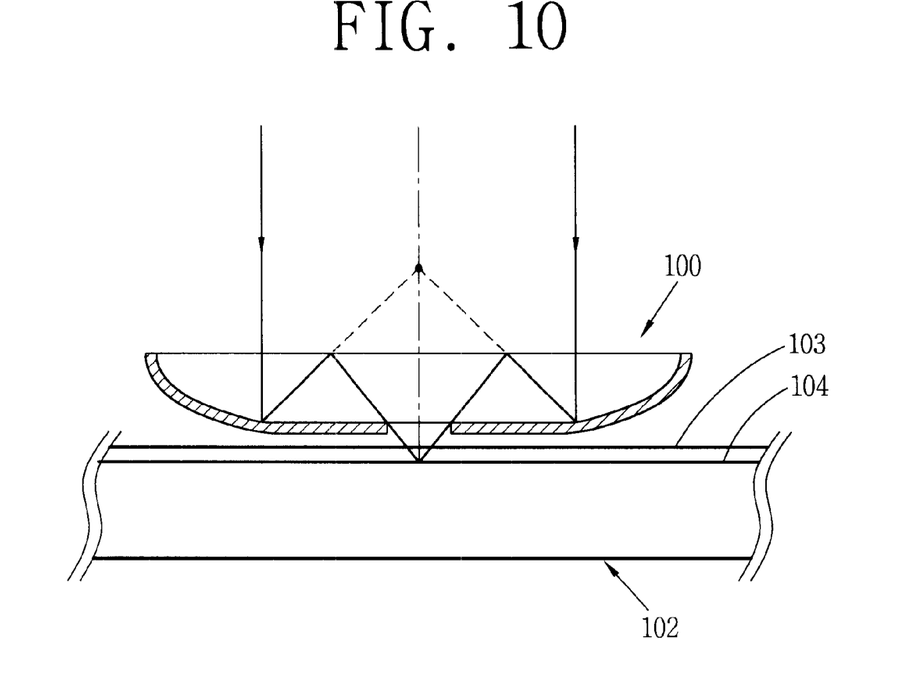
FIG. 10 is an explanatory view of formation of a focal point on a recording medium in accordance with the second embodiment of the present invention.

FIG. 10 is an explanatory view of formation of a focal point on a recording medium in accordance with the second embodiment of the present invention, in which the lens of FIG. 9 is adjacent to the recording medium.

As shown in the drawing, a protective film 103 is formed on the surface of the recording medium 102, and a recording layer 104 is formed at the lower portion of the protective film 103.

Since the focal point of the lens 100 is formed at a lower position than the lower surface of the lens, the focal point can be formed on the recording layer 104. Therefore, even if a foreign material such as a dust is introduced between the recording medium and the lower surface of the lens, that doesn't affect formation of the focal point of the light.

Since the present invention takes advantage of the total reflection inside the lens, it is important to reduce the light which is transmitted to outside the lens, rather than being subjected to the total reflection.

As stated above, in order to make the total reflection, it is important that the light is made incident by more than the critical angle between two mediums having different refractivity to each other.

With reference back to FIG. 8, the light 46 made incident in parallel on the lens is reflected on the lower face 41 of the lens 40 and totally reflected on the plane portion 42. In this respect, however, the light made incident at the center of the plane portion of the lens is reflected on the lower face of the lens and proceeds toward the plane portion of the lens at a small angle, total reflection is hardly made.

Accordingly, if light that is initially made incident is collected to the marginal portion (that is, the region at which the light proceeds toward the plane portion at a larger angle than the critical angle when it is reflected after being made incident), not to the center of the plane portion of the lens, the loss of light not being reflected on the central region could be reduced.

Another embodiment of the present invention includes an annular beam generator for generating light to thereby reduce loss of light.

Figure 11:
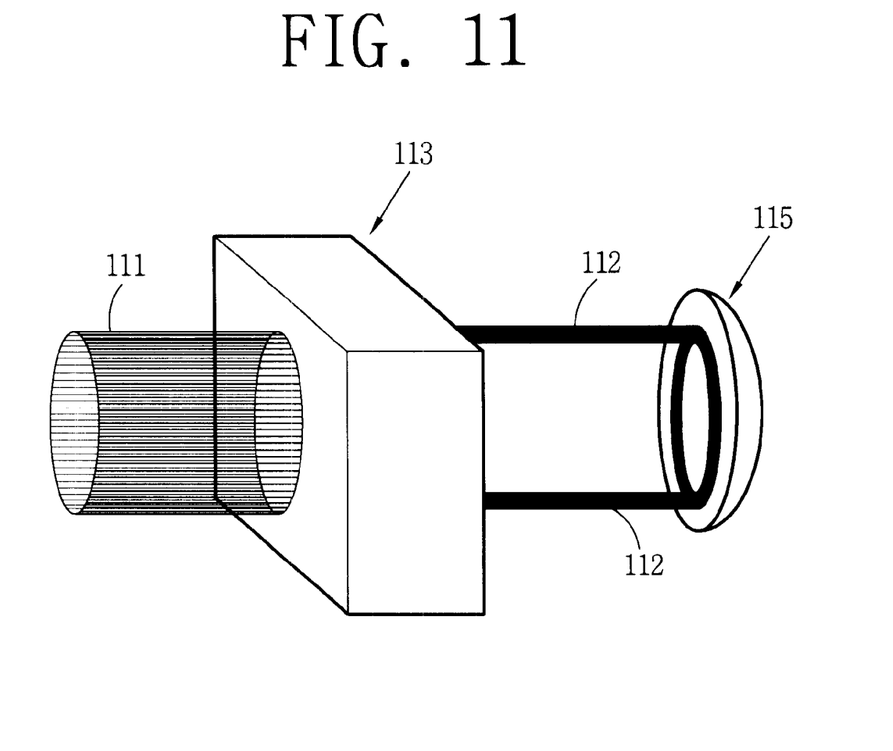
FIG. 11 illustrates an annular beam generator in accordance with a third embodiment of the present invention.

FIG. 11 illustrates an annular beam generator in accordance with a third embodiment of the present invention With reference to FIG. 11, light 111 made incident in parallel is changed to an annular light 112 through an annular beam generator 113 and made incident on a lens 115.

The annular beam generator can be fabricated in various ways. For example, it is fabricated by using a diffraction device or by coupling two lenses.

Figure 12A:
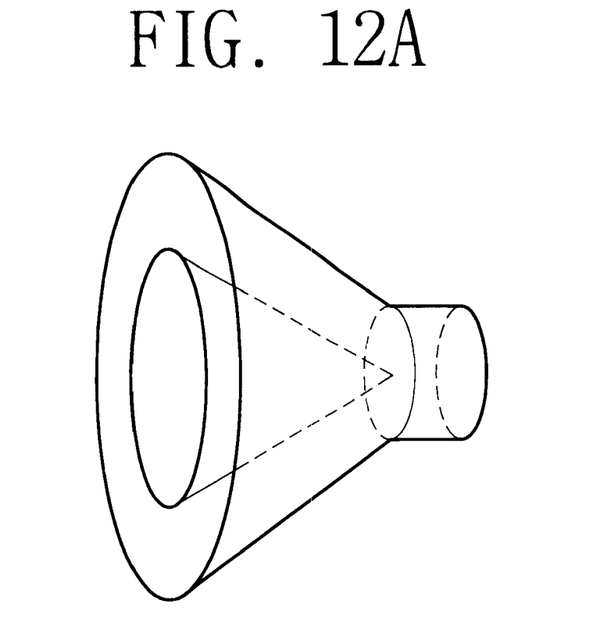
FIGS. 12A and 12B illustrate a conic-shaped annular beam generator in accordance with the present invention.
Figure 12B:
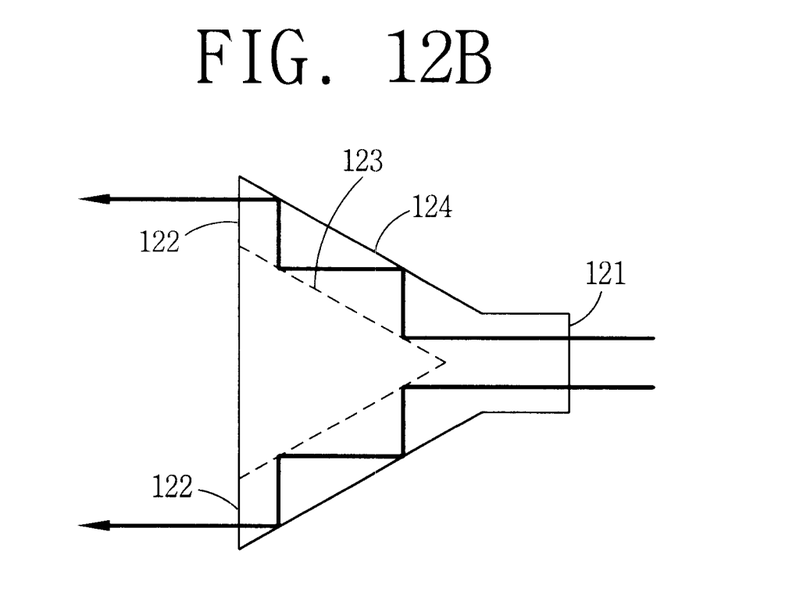

FIG. 12A illustrates a conic-shaped annular beam generator in accordance with the present invention and FIG. 12B illustrates the parallel incident beam is changed to annular light through the annular beam generator.

Coming into the entrance 121 of the generator, the light comes out through the exit 122 after being reflected for several times.

Since the exit is in a ring shape, the annular light comes out from the generator. The annular light is made incident on the high resolution lens and mostly totally reflected.

The high resolution lens of the present invention may be adopted to various technical fields, of which detailed descriptions will now be described.

Figure 13:
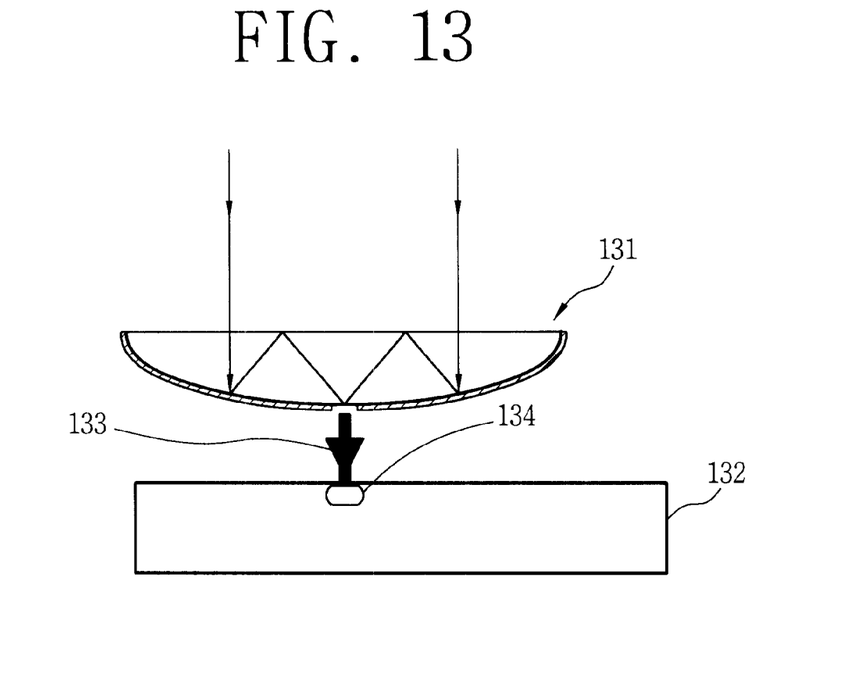
FIG. 13 illustrates a method for recording information by using the high resolution lens in accordance with the present invention.

FIG. 13 illustrates a method for recording information by using the high resolution lens in accordance with the present invention.

As shown in the drawing, when a recording medium 132 comes near the lower surface of the lens 131 by about 50 nm, light energy 133 is transmitted to the surface of the medium due to the light near-field effect.

The light energy heats the portion 134 at the surface of the medium. As the portion is heated, bit can be formed on the surface of the medium. That is, a data can be recorded. The data is reproduced in the same manner as described above.

Figure 14:
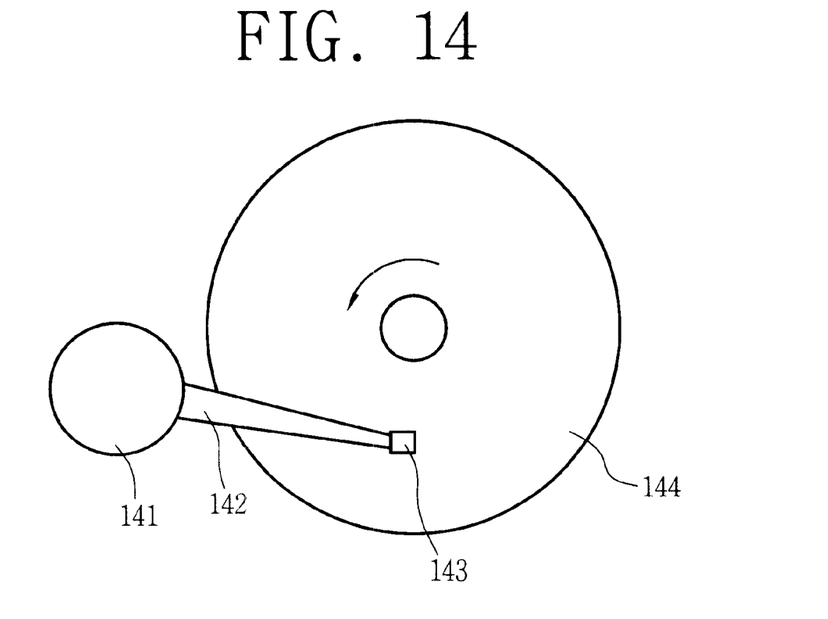
FIG. 14 is a schematic view showing a portion of an information recording apparatus in accordance with the present invention.

FIG. 14 is a schematic view showing a portion of an information recording apparatus in accordance with the present invention. The information recording apparatus includes a recording medium 144 and a head unit. The head unit includes a suspension 142, a suspension support 141 and a slider 143.

The lens of the present invention is mounted at the slider so as to approach the recording medium. When the recording medium is rotated at a high speed, the slider is lifted up from the surface of the recording medium, maintaining a space of scores of nanometer therebetween.

There may be various supply units of light made incident on the lens of the present invention. Since the pneumatic lift head slider should be light, a heavy light source shouldn't be mounted at the slider.

Figure 15:
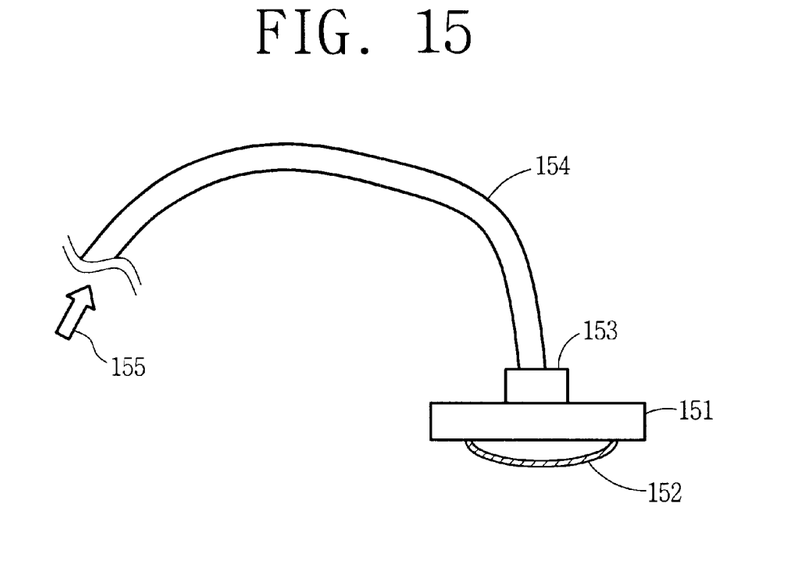
FIG. 15 illustrates using of optical fiber as a light source in accordance with the present invention.

FIG. 15 illustrates supply of light 155 by means of an optical fiber 154.

As shown in the drawing, a lens 152 of the present invention is attached at the lower surface of the head slider 152, and the upper surface of the slider is coupled with an optical fiber 154 through the connection unit 153. When light is supplied through the optical fiber, the whole device is simplified and the variation in the assembly deviation occurring when a light supply unit is assembled can be reduced.

Figure 16:
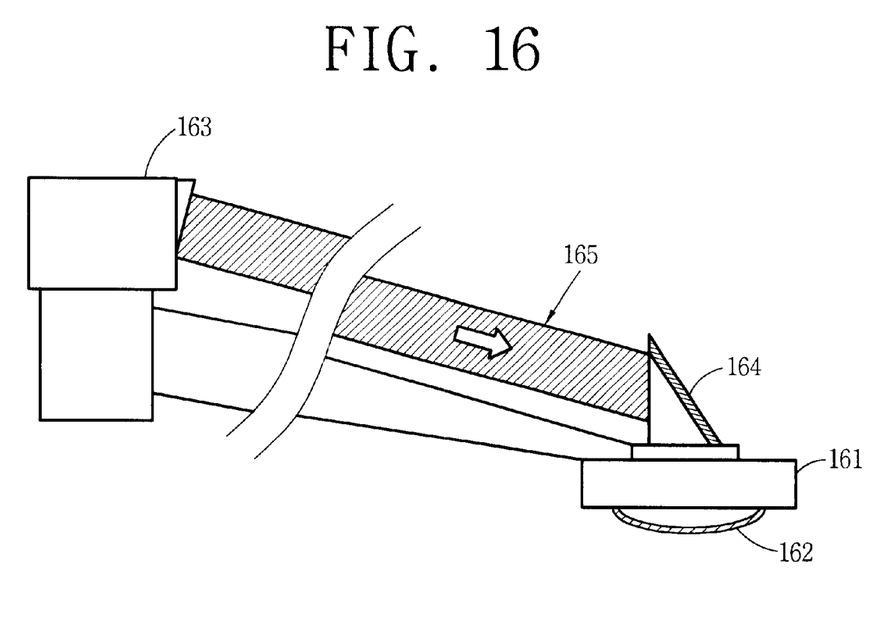
FIG. 16 illustrates using of a micro-mirror as a light supply unit in accordance with the present invention.

FIG. 16 illustrates use of a micro-mirror as a light supply unit in accordance with the present invention.

As shown in the drawing, a light supply unit 163 is placed at a portion (i.e., at a suspension support), rather than being directly mounted at a slider 161. As the light supply unit, a laser diode is used. The micro-mirror 164 is mounted on the upper surface of the slider 161, and a lens 162 of the present invention is mounted at the lower portion of the slider.

When light 165 is directed from the light supply unit to the head slider, the light is reflected on the micro-mirror mounted at the head slider and then is made incident on the lens.

Figure 17:
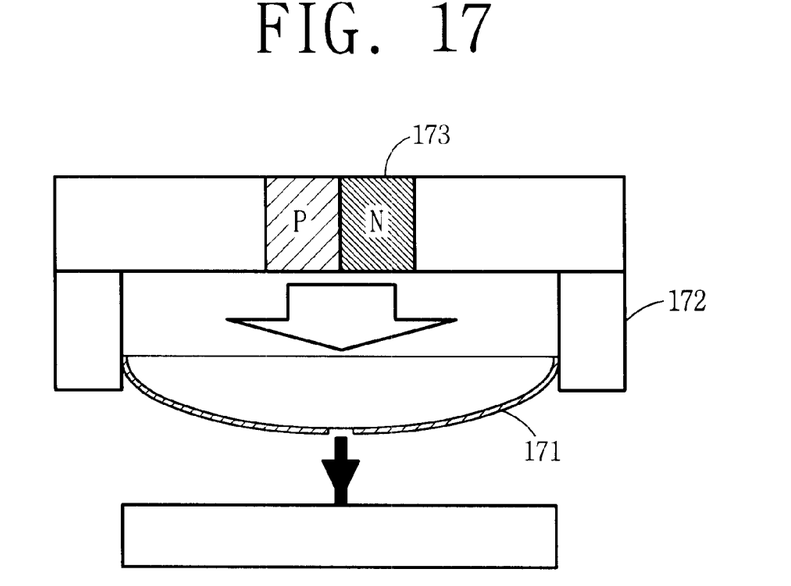
FIG. 17 illustrates using of a laser diode as a light source in accordance with the present invention.

As a light supply unit, a laser diode may be used by being integrated with the high resolution lens of the present invention, FIG. 17 illustrates use of a laser diode as a light source in accordance with the present invention.

As shown in the drawing, a laser diode 173 is mounted at the upper portion of a slider 172, and a light generated from the laser diode is directly made incident on a lens 171 of the present invention.

The devices using the high resolution lens requires a light sensor to detect light reflected from the recording medium or the object for measurement. There are several light sensors, such as a photo diode.

Figure 18:
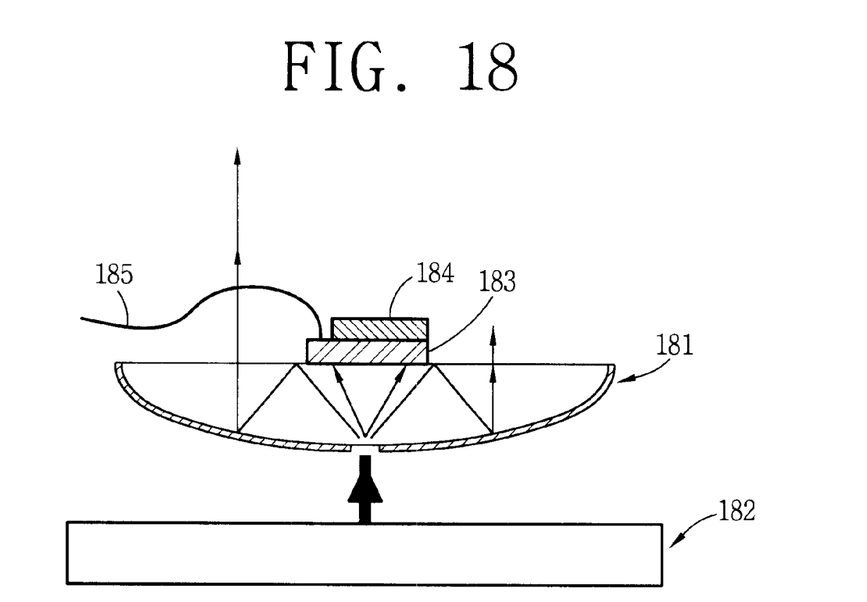
FIG. 18 illustrates a lens integrated with an optical sensor in accordance with the present invention.

FIG. 18 illustrates a lens integrated with an optical sensor in accordance with the present invention.

As shown in the drawing, since an optical sensor 183 is formed integrated with a lens 181 of the present invention, its structure is simplified. The light reflected from a recording medium 182 is detected by the optical sensor, and the detected light is converted to an electric signal by the sensor and transmitted through a wire 185 to the outside. Reference numeral 184 denotes an incident light cut-off film.

Figure 19:
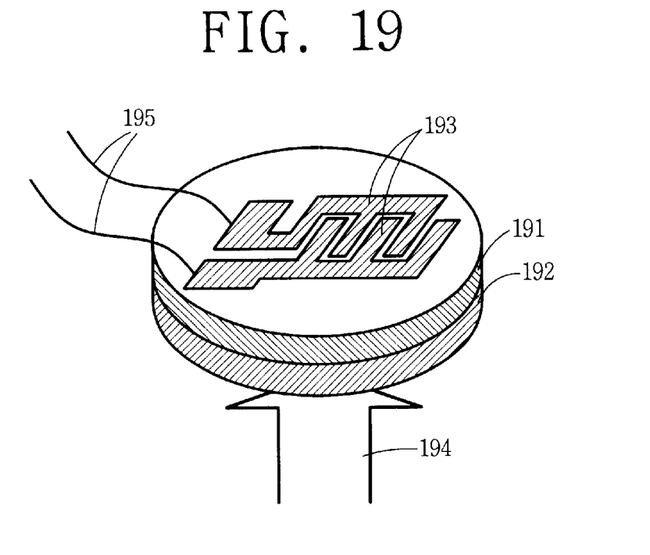
FIG. 19 is a detailed view of the optical sensor of FIG. 18 in accordance with the present invention.

FIG. 19 shows a photo diode as an optical sensor of FIG. 18 in accordance with the present invention.

As shown in the drawing, when reflected light 194 is made incident on the bottom surface of a photo diode 191, current flows to an electrode 193. The current is transmitted through a transmitting unit, such as a wire, to the outside, thereby measuring an amount of the reflected light. Reference number 192 denotes an insulator.

The lens of the present invention can be also applied to an optical measurement, another applied field.

Figure 20:
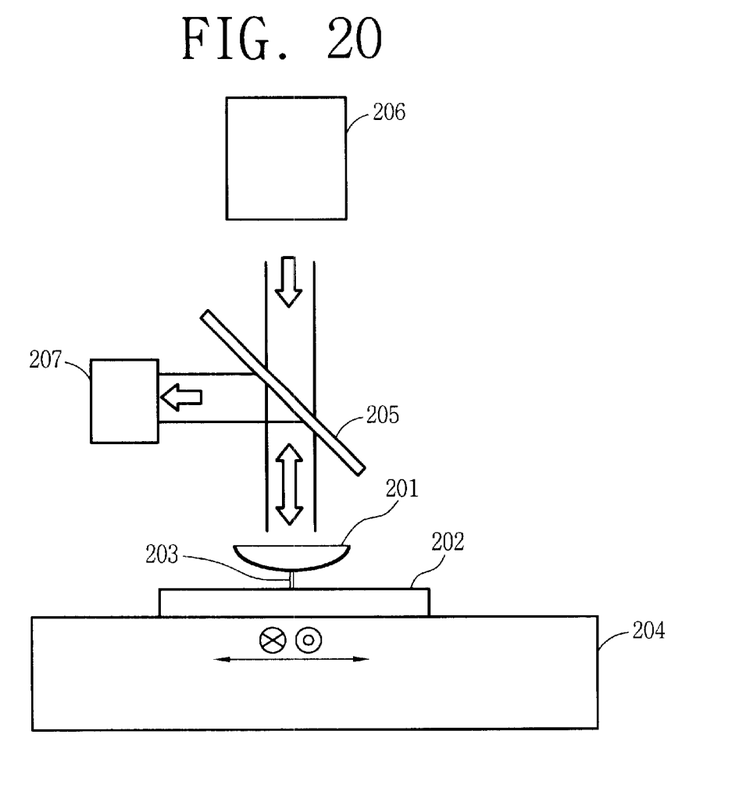
FIG. 20 illustrates an optical measurement apparatus adopting the high resolution lens in accordance with the present invention.

FIG. 20 shows surface measurement by the high resolution lens in accordance with the present invention.

As shown in the drawing, the light coming out from a light source 206 is made incident on an object for measurement after passing through a semipermeable mirror 205 and a lens 201, and the light reflected from the object for measurement passes the lens and is partially made incident on the optical sensor 207 due to the semipermeable mirror. A predetermined portion of the object for measurement can be optically observed by means of a shift unit 204 positioned at the lower portion of the object for measurement while moving the object.

The lens of the present invention can be used for a lithography apparatus. In a semiconductor lithography, the size of a light spot has a direct relation with the size of the minimum light width that can be implemented.

Figure 21:
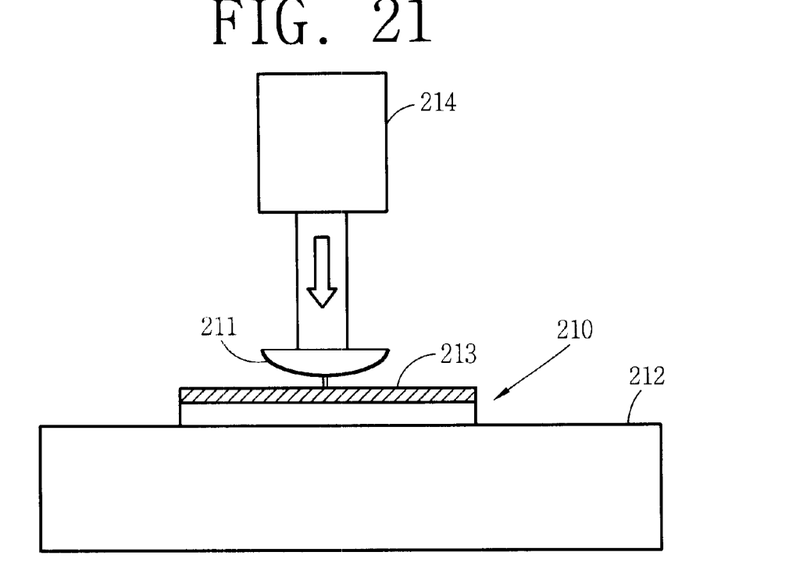
FIG. 21 illustrates a lithography apparatus adopting the high resolution lens in accordance with the present invention.

FIG. 21 is a schematic view showing a structure of lithography using the high resolution parabolic lens in accordance with the present invention.

As shown in the drawing, the light coming out from a light source 214 passes a high resolution lens 211 of the present invention and photo-senses a resist layer 213 formed on the upper surface of a wafer 210. Reference numeral 212 denotes a stapper.

The high resolution lens of the present invention can be also applied to an optical magnetic information storing apparatus, another applied field.

Figure 22:
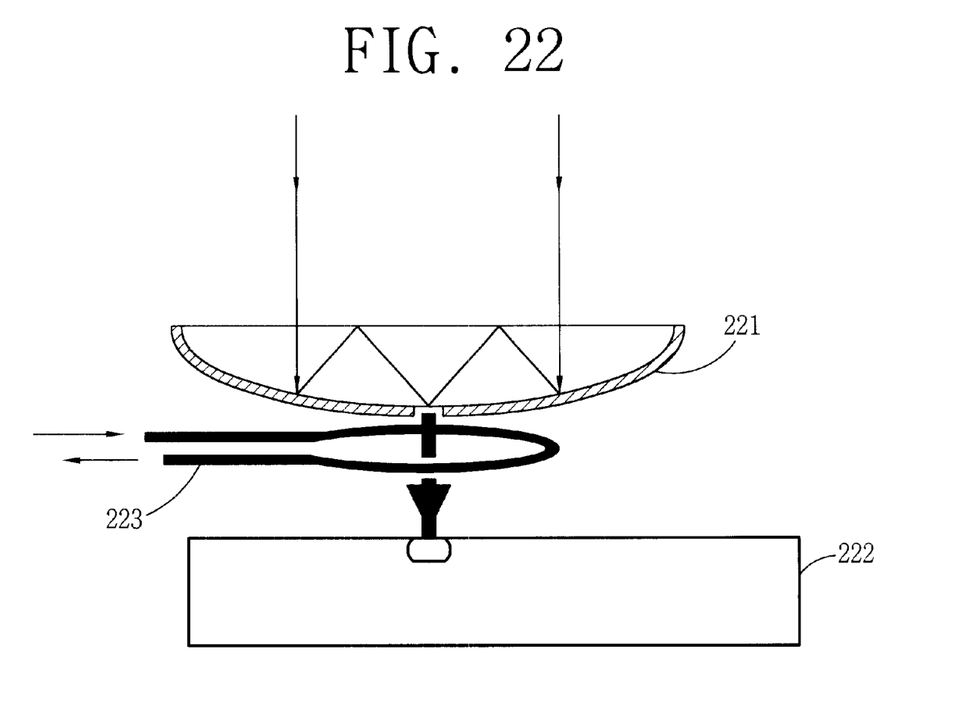
FIG. 22 illustrates an example of an optical magnetic recording by a magnetized coil.

FIG. 22 illustrates a high resolution parabolic lens with a magnetizing coil in accordance with the present invention.

As shown in the drawing, in order to store a data on an optical magnetic disk, a circular magnetizing coil 223 is installed at a lower portion of a lens 221. After light is collected on the surface of a recording medium through the lens and heat it, when light is cut off and current is applied to the magnetizing coil, the heated portion is magnetized.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A high resolution lens as a condensing lens for collecting light made incident from a light source, wherein one face of the lens is plane and the other face is curved, the curved face is coated with a reflecting material except for its central apex portion, and incident light is made incident through the plane face of the lens and collected using a total reflection provided by the entire plane face of the lens.

2. The high resolution lens according to claim 1, wherein a central portion of the curved face is plane and a marginal portion of the curved faced is curved.

3. The high resolution lens according to claim 2, wherein the incident light internally reflected within the lens is focused at a focal point formed lower than the central apex portion of the curved face of the lens.

4. The high resolution lens according to claim 1, wherein the light made incident through the plane face of the lens is reflected by the reflecting material of the curved face and again totally reflected on the plane face.

5. The high resolution lens according to claim 1, wherein the curved face is a spherical one.

6. The high resolution lens according to claim 1, wherein the curved face is a parabolic one.

7. The high resolution lens according to claim 6 wherein the light made incident through the plane face of the lens is reflected by the reflecting material of the curved face and again totally reflected on the plane face, so as to be collected at the central apex portion of the curved face.

8. The high resolution lens according to claim 1, wherein an annular beam generator is placed on the path where the light is coming out from the light source.

9. The high resolution lens according to claim 8, wherein the annular beam generator changes the light made incident on the lens to a ring-shaped light, thereby limiting the incident beam to a marginal portion of the plane face of the lens.

10. The high resolution lens according to claim 8, wherein the annular beam generator has a structure that two conic objects having different sizes to each other are coupled, of which an entrance into which light is made incident is positioned at an angular point of each conic object and an exit for discharging light is positioned at a bottom surface of each conic object, the exit forming a ring-shaped light path by the two conic objects.

11. A high resolution lens as a condensing lens for collecting light made incident from a light source, wherein an upper surface of the lens is plane, a central portion of a lower face of the lens is plane, and a marginal portion of the lower face of the lens is curved, the lower face of the lens is coated with a reflecting material except for its central apex portion, and incident light is made incident on the plane upper face of the lens and collected using a total reflections provided by the entire plane upper face of the lens.

12. The high resolution lens according to claim 11, wherein the incident light internally reflected within the lens is focused at a focal point formed lower than the central apex portion of the lower face of the lens.

* * * * *